(12) United States Patent
Lee et al.

(10) Patent No.: US 8,043,898 B2
(45) Date of Patent: Oct. 25, 2011

(54) METHOD OF MANUFACTURING SEMICONDUCTOR PACKAGE WITH ETCH REMOVAL OF CARRIER FRAME AND BASE PLATING LAYER

(75) Inventors: Ji-Yong Lee, Namyangju-si (KR); Kwang-Wook Choi, Seoul (KR)

(73) Assignee: Col Tech Co., Ltd, Seoul (KR)

( * ) Notice: Subject to any disclaimer, the term of this patent is extended or adjusted under 35 U.S.C. 154(b) by 198 days.

(21) Appl. No.: 12/519,546

(22) PCT Filed: Dec. 20, 2007

(86) PCT No.: PCT/KR2007/006687
§ 371 (c)(1),
(2), (4) Date: Jun. 17, 2009

(87) PCT Pub. No.: WO2008/075908
PCT Pub. Date: Jun. 26, 2008

(65) Prior Publication Data
US 2009/0305466 A1    Dec. 10, 2009

(30) Foreign Application Priority Data

Dec. 19, 2006  (KR) .......................... 10-2006-0130246

(51) Int. Cl.
*H01L 21/60*    (2006.01)

(52) U.S. Cl. ........ 438/121; 438/124; 438/126; 438/127; 438/494; 257/666; 257/674; 257/735; 257/E21.506

(58) Field of Classification Search ................... 438/15, 438/25, 26, 51, 55, 64, 112, 124, 126, 127, 438/40, 254, 494, 498, 634, 669–757, 924, 438/940; 257/666, 674, 677, 690, 692, 735, 257/736, E21.506; 205/80–333; 427/436
See application file for complete search history.

(56) References Cited

U.S. PATENT DOCUMENTS

| | | | |
|---|---|---|---|
| 6,882,048 B2 | 4/2005 | Ikenaga et al. | |
| 6,946,324 B1* | 9/2005 | McLellan et al. | 438/111 |
| 7,033,517 B1* | 4/2006 | Fan et al. | 216/13 |
| 2002/0149090 A1 | 10/2002 | Ikenaga et al. | |

FOREIGN PATENT DOCUMENTS

| | | |
|---|---|---|
| JP | 8-83878 | 3/1996 |
| JP | 2000-311968 | 11/2000 |
| KR | 10-2006-108250 | 10/2006 |

* cited by examiner

*Primary Examiner* — Hsien Ming Lee
*Assistant Examiner* — Walter H Swanson
(74) *Attorney, Agent, or Firm* — Ladas & Parry LLP

(57) ABSTRACT

A method of manufacturing a semiconductor package is provided, which can improve the quality of plating through reduction of plating deviation, and improve molding and soldering efficiencies in forming a molding compound and packaging the semiconductor package onto a printed circuit board.

19 Claims, 9 Drawing Sheets

METHOD OF MANUFACTURING SEMICONDUCTOR PACKAGE WITH ETCH REMOVAL OF CARRIER FRAME AND BASE PLATING LAYER

TECHNICAL FIELD

The present invention relates to a method of manufacturing a semiconductor package, and more particularly to a method of manufacturing a semiconductor package, which can improve the quality of plating through reduction of plating deviation, and improve the moldability and soldering efficiency in molding with a molding compound and packaging the semiconductor package onto a printed circuit board.

BACKGROUND ART

Generally, semiconductor assembly is performed in a manner that a semiconductor package is manufactured using a substrate or a lead frame, and then solder balls or solder pastes are printed on a printed circuit board. Here, a BGA (Ball Grid Array) substrate using a polyimide (PI) film has been generally used as the semiconductor substrate, and a metal lead frame has been generally used as the lead frame.

However, according to the conventional method of manufacturing a semiconductor package, in forming a copper plating layer after forming a pattern on a carrier frame, the copper plating is not performed over the whole area of the carrier frame, and thus the plating deviation becomes too large, resulting in that semiconductor quality deteriorates due to the inferior plating quality.

Also, in molding an upper part of a carrier frame with a molding compound after a die and lead portions are bonded with wires, the molding compound is in direct contact with metal portions, and this causes the bonding strength between the carrier frame and the molding compound, i.e., the moldability, to deteriorate.

DISCLOSURE

Technical Problem

The present invention has been made in view of the foregoing problems, and it is an object of the present invention to provide a method of manufacturing a semiconductor package, which can improve the quality of plating through reduction of plating deviation, and improve the moldability and soldering efficiency in molding with a molding compound and packaging the semiconductor package onto a printed circuit board.

It is another object of the present invention to provide a method of manufacturing a semiconductor package, which can promptly and easily manufacture the semiconductor package.

Technical Solution

In order to achieve the above objects, in one aspect of the present invention, there is provided a method of manufacturing a semiconductor package, which includes a first step of forming a first pattern layer including pad and lead portions on a carrier frame using photoresist; a second step of forming a base plating layer on the whole part of the carrier frame except for the pad and lead portions with the same height as the first pattern layer; a third step of removing the first pattern layer and forming first plating laminated portions for forming a metal bump on a part from which the first pattern layer has been removed; a fourth step of laminating a second pattern layer on the base plating layer using the photoresist; a fifth step of laminating second plating laminated portions on the first plating laminated portions; a sixth step of removing the second pattern layer; a seventh step of forming an oxide layer on side surfaces of the second plating laminated portions from which the second pattern layer has been removed; an eighth step of laminating a pad frame on the second plating laminated portions that correspond to the pad portion and attaching a die onto the pad frame; and a ninth step of removing by etching or physical method the carrier frame and the base plating layer after boding the second plating laminated portions that correspond to the die and the lead portion with wires and molding an upper part of the carrier frame with a molding compound.

In another aspect of the present invention, there is provided a method of manufacturing a semiconductor package, which includes a first step of forming a pattern layer on a part of a carrier frame except for pad and lead portions using photoresist; a second step of forming a base plating layer on the whole pad and lead portions with a height lower than the pattern layer; a third step of forming plating laminated portions on the base plating layer; a fourth step of removing the pattern layer; a fifth step of forming an oxide layer on side surfaces of the plating laminated portions from which the pattern layer has been removed; a sixth step of laminating a pad frame on the plating laminated portions that correspond to the pad portion and attaching a die onto the pad frame; a seventh step of removing by etching or physical method the carrier frame and the base plating layer after boding the plating laminated portions that correspond to the die and the lead portion with wires and molding an upper part of the carrier frame with a molding compound; and an eighth step of attaching solder balls onto lower ends of the plating laminated portions that correspond to the lead portion.

Advantageous Effects

According to the method of manufacturing a semiconductor package according to the present invention as constructed above, since the base plating layer is plated on the whole part of the carrier frame except for the pad portion and the lead portion, the plating quality is improved, and the bonding strength between the plating laminated portions and the molding compound is improved through the forming of the oxide layer. Also, since it is not required to attach separate solder balls, the semiconductor package can be manufactured promptly and easily. In particular, the method of manufacturing a semiconductor package according to the present invention is suitable for a high pin count.

BRIEF DESCRIPTION OF THE DRAWINGS

The foregoing and other objects, features and advantages of the present invention will become more apparent from the following detailed description when taken in conjunction with the accompanying drawings in which.

BEST MODE

Reference will now be made in detail to a chiller system for semiconductor manufacturing equipment according to the preferred embodiments of the present invention with reference to the accompanying drawings. The matters defined in the description, such as the detailed construction and elements, are nothing but specific details provided to assist those of ordinary skill in the art in a comprehensive understanding of the invention, and the present invention is not limited to the embodiments disclosed hereinafter.

Figure 1:
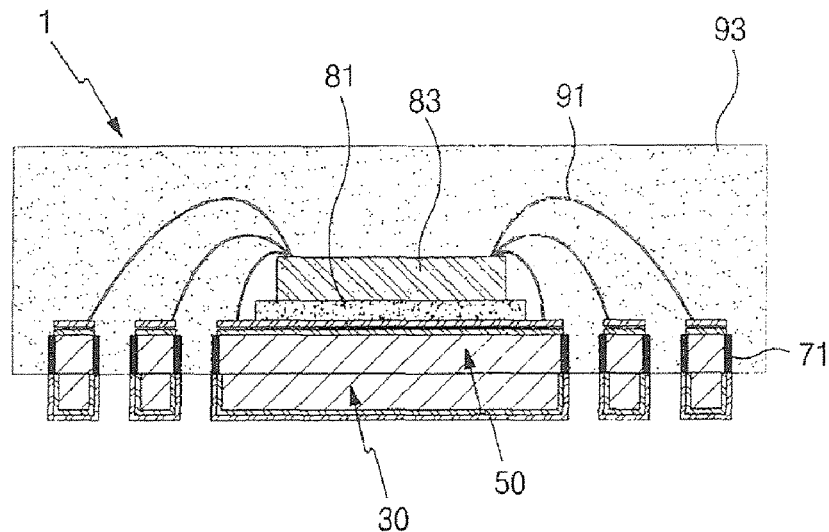
FIG. 1 is a sectional view of a semiconductor package manufactured by a method according to an embodiment of the present invention.
Figure 2A:
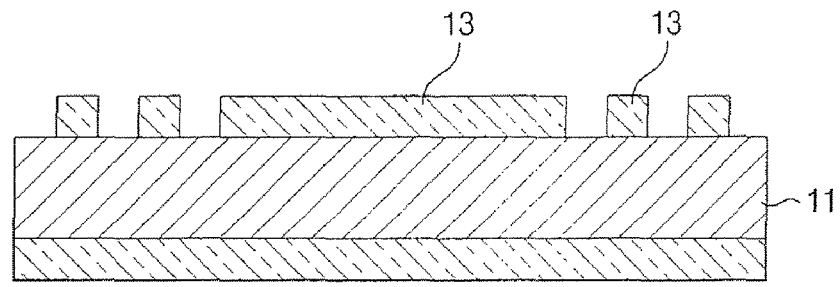
FIGS. 2a to 2i are views illustrating a process of manufacturing a semiconductor package according to an embodiment of the present invention.
Figure 2B:
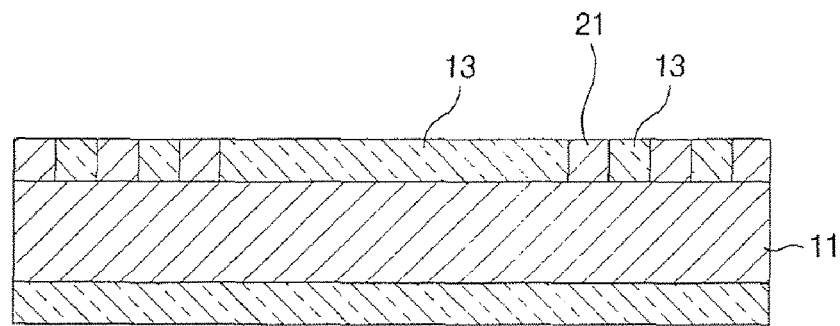
Figure 2C:
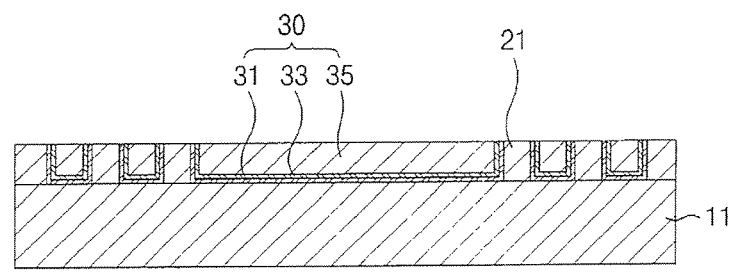
Figure 2D:
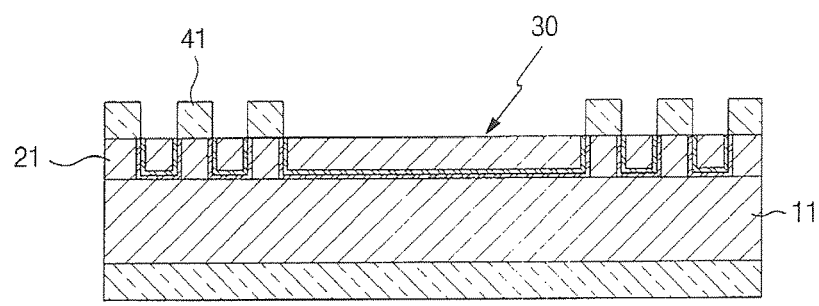
Figure 2E:
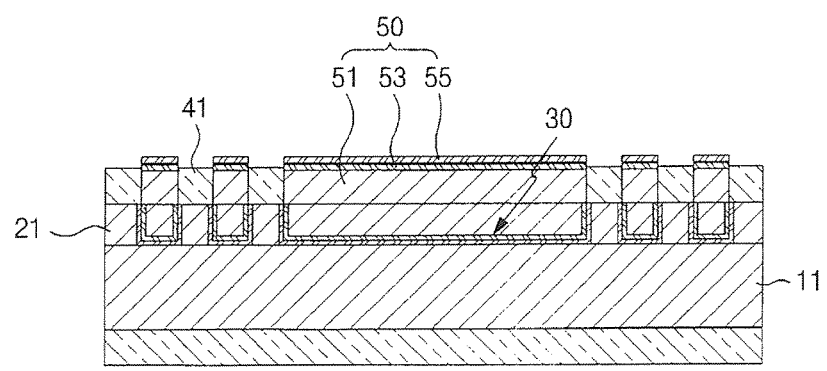
Figure 2F:
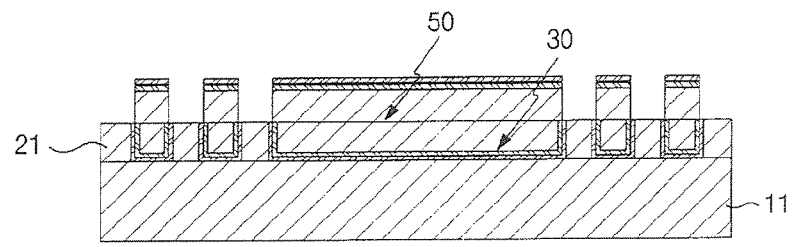
Figure 2G:
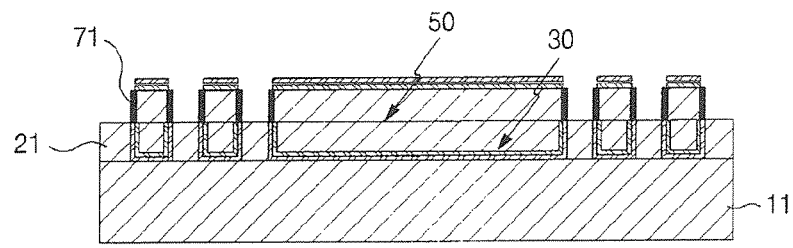
Figure 2H:
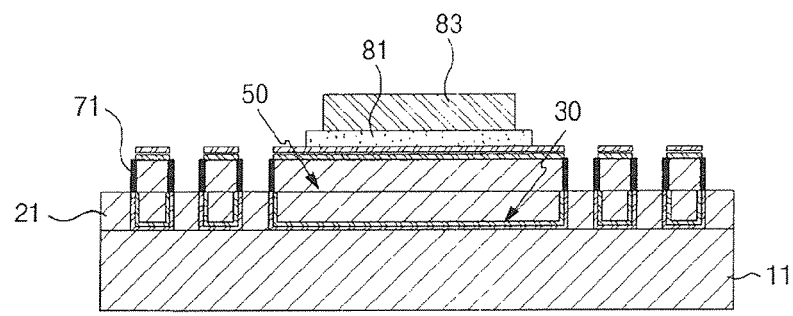
Figure 2I:
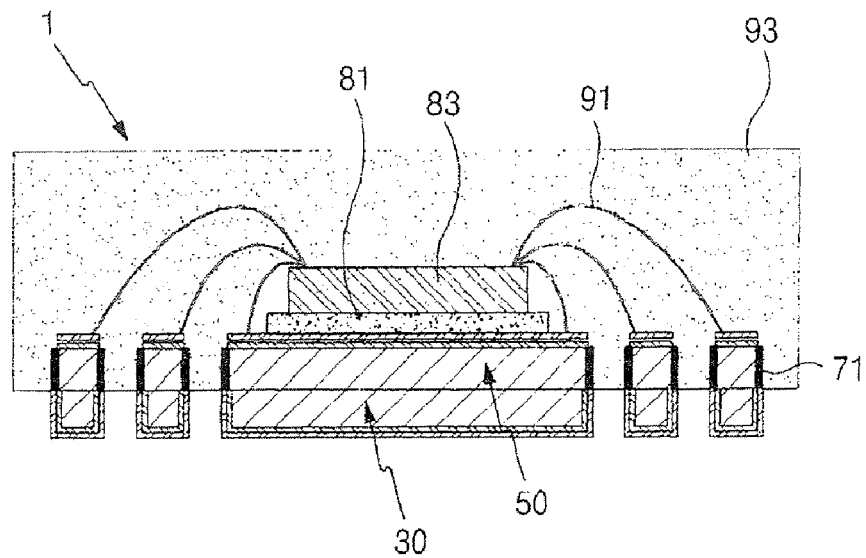
Figure 3A:
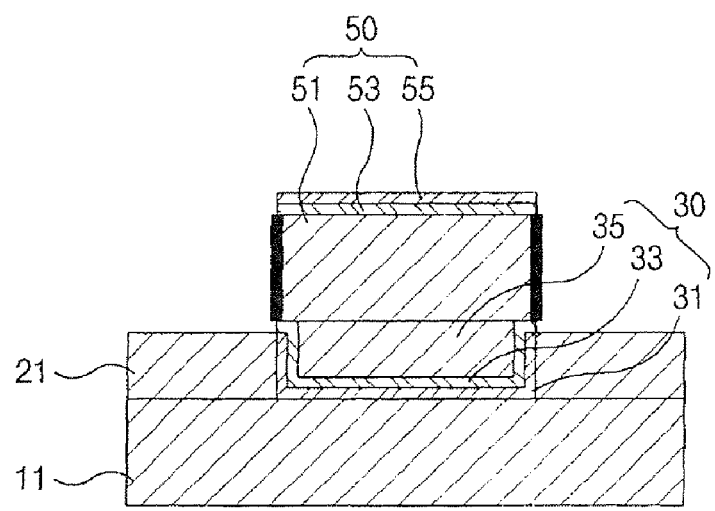
FIGS. 3a to 3c are sectional views illustrating modified examples of first and second plating laminated portions in a method of manufacturing a semiconductor package according to an embodiment of the present invention.
Figure 3B:
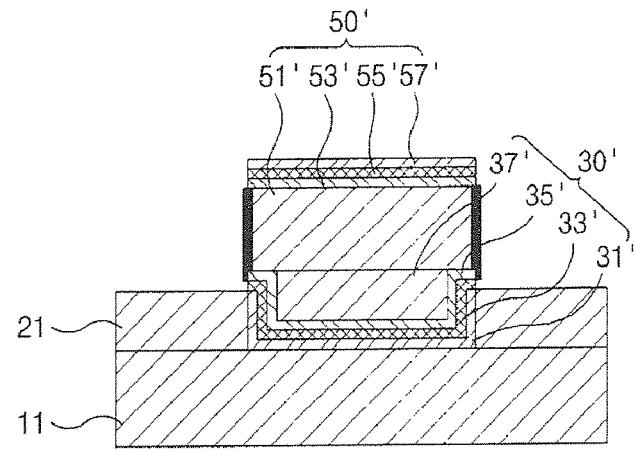
Figure 3C:
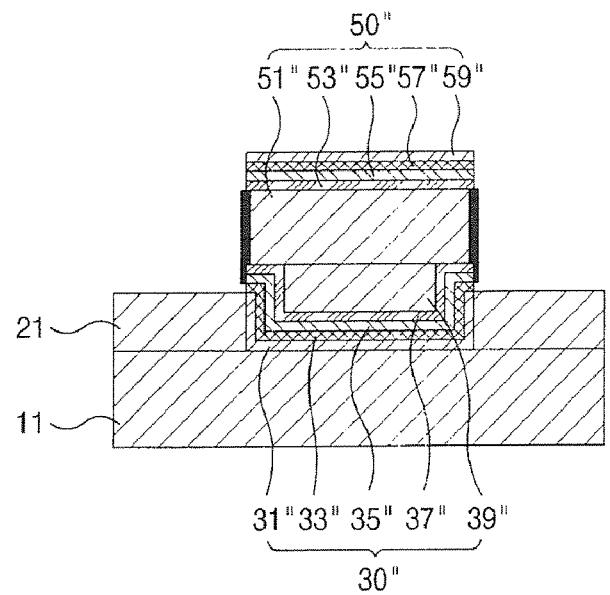

FIG. 1 is a sectional view of a semiconductor package 1 manufactured by a method according to an embodiment of the present invention, and FIGS. 2a to 2i are views illustrating a process of manufacturing a semiconductor package 1 according to an embodiment of the present invention. FIGS. 3a to 3c are sectional views illustrating modified examples of first plating laminated portions 30, 30', and 30" and second plating laminated portions 50, 50', and 50" in a method of manufacturing a semiconductor package according to an embodiment of the present invention.

The method of manufacturing a semiconductor package 1 according to an embodiment of the present invention can improve the quality of plating, bonding efficiency, and moldability, and also improve the soldering efficiency in packaging the semiconductor package onto a printed circuit board. As illustrated in FIGS. 1 to 2i, the method of manufacturing a semiconductor package 1 according to an embodiment of the present invention includes a first step of forming a first pattern layer 13 including pad and lead portions on a carrier frame 11 using photoresist; a second step of forming a base plating layer 21 on the whole part of the carrier frame except for the pad and lead portions with the same height as the first pattern layer 13; a third step of removing the first pattern layer 13 and forming first plating laminated portions 30, 30', and 30" for forming a metal bump on a part from which the first pattern layer has been removed; a fourth step of laminating a second pattern layer 41 on the base plating layer 21 using the photoresist; a fifth step of laminating second plating laminated portions 50, 50', and 50" on the first plating laminated portions 30, 30', and 30"; a sixth step of removing the second pattern layer 41; a seventh step of forming an oxide layer 71 on side surfaces of the second plating laminated portions 50, 50', and 50" from which the second pattern layer 41 has been removed; an eighth step of laminating a pad frame 81 on the second plating laminated portions 50, 50', and 50" that correspond to the pad portion and attaching a die 83 onto the pad frame 81; and a ninth step of removing by etching or physical method the carrier frame 11 and the base plating layer 21 after boding the second plating laminated portions 50, 50', and 50" that correspond to the die 83 and the lead portion with wires 91 and molding an upper part of the carrier frame 11 with a molding compound 93.

Here, the carrier frame 11 is to form a base plate for manufacturing the semiconductor package 1 including forming of a pattern, and it is preferable that the carrier frame is formed with copper or copper alloys, or nickel or nickel alloys.

On the carrier frame 11, the first pattern layer 13, which includes the pad portion on which the die 83 is laminated and various kinds of lead portions, is formed using photoresist.

Then, the base plating layer 21 is formed on the carrier frame 11, on which the first pattern layer 13 is formed, with the same height as the first pattern layer 13. The base plating layer 21 is an important part that determines the plating quality, and it is preferable that the base plating layer is formed on the whole part of the carrier frame 11 except for the pad portion and the lead portion to provide a superior plating quality. Also, the base plating layer 21 may be plated with one of copper or copper alloys, nickel or nickel alloys, gold, silver or silver alloys, and tin or tin alloys.

In order to form a metal bump after the base plating layer 21 is formed, the first pattern layer 13 is removed, and then the first plating laminated portions 30, 30', and 30" are formed on the part from which the first pattern layer 13 has been removed. Thereafter, the second pattern layer 41 is formed on the base plating layer 21 using the photoresist, the second plating laminated portions 50, 50', and 50" are formed on the first plating laminated portions 30, 30', and 30" for wire bonding, and then the second pattern layer 41 is removed.

Here, as illustrated in FIGS. 3a to 3c, the first plating laminated portions 30, 30', and 30" for forming the metal bump and the second plating laminated portions 50, 50', and 50" for the wire bonding may be formed in diverse forms.

First, as illustrated in FIG. 3a, the first plating laminated portion 30 may be composed of a first plating layer 31 plated with gold or gold alloys, a second plating layer 33 plated with nickel or nickel alloys, and a third plating layer 35 plated with copper or copper alloys, which are laminated in order. The second plating laminated portion 50 may be composed of a fourth plating layer 51 plated with copper or copper alloys, a fifth plating layer 53 plated with nickel or nickel alloys, and a sixth plating layer 55 plated with gold, gold alloys, silver or silver alloys, which are laminated in order.

In another embodiment of the present invention, as illustrated in FIG. 3b, the first plating laminated portion 30' may be composed of a first plating layer 31' plated with gold fresh, a second plating layer 33' plated with gold/silver alloys, a third plating layer 35' plated with nickel or nickel alloys, and a fourth plating layer 37' plated with copper or copper alloys, which are laminated in order. The second plating laminated portion 50' may be composed of a fifth plating layer 51' plated with copper or copper alloys, a sixth plating layer 53' plated with nickel or nickel alloys, a seventh plating layer 55' plated with gold/silver alloys, and an eighth plating layer 57' plated with gold fresh, which are laminated in order.

Here, it is preferable that the gold/silver alloys forming the second plating layer 33' and the seventh plating layer 55' may be composed of 30 weight percent (wt %) gold and 70 wt % silver.

In still another embodiment of the present invention, as illustrated in FIG. 3c, the first plating laminated portion 30" may be composed of a first plating layer 31" plated with gold fresh, a second plating layer 33" plated with gold/silver alloys, a third plating layer 35" plated with nickel or nickel alloys, a fourth plating layer 37" plated with nickel/copper alloys, and a fifth plating layer 39" plated with copper or copper alloys, which are laminated in order. The second plating laminated portion 50" may be composed of a sixth plating layer 51" plated with copper or copper alloys, a seventh plating layer 53" plated with nickel/copper alloys, an eighth plating layer 55" plated with nickel or nickel alloys, a ninth plating layer 57" plated with gold/silver alloys, and a tenth plating layer 59" plated with gold fresh, which are laminated in order.

Here, it is preferable that the gold/silver alloys forming the second plating layer 33" and the ninth plating layer 57" may be composed of 30 weight percent (wt %) gold and 70 wt % silver, and the nickel/copper alloys forming the fourth plating layer 37" and the seventh plating layer 53" may be composed of 70 wt % nickel and 30 wt % copper.

In the foregoing description, it is exemplified that the first plating laminated portions 30, 30', and 30" are formed on the part from which the first pattern layer 13 has been removed, the second pattern layer 41 is laminated on the base plating layer 21, the second plating laminated portions 50, 50', and 50" are formed on the first plating laminated portions 30, 30', and 30", and then the second pattern layer 41 is removed. However, according to another embodiment of the present invention, the second pattern layer 41 is laminated on the base plating layer 21 after the first pattern layer 13 is removed, and then the first plating laminated portions 30, 30', and 30" and the second plating laminated portions 50, 50', and 50" may be simultaneously formed on the part from which the first pattern layer 13 has been removed. In this case, the third plating layer 35 of the first plating laminated portion 30 and the fourth plating layer 51 of the second plating laminated portion 50, the fourth plating layer 37' of the first plating laminated portion 30' and the fifth plating layer 51' of the second plating laminated portion 50', and the fifth plating layer 39" of the first plating laminated portion 30" and the sixth plating layer 51" of the second plating laminated portion 50" can be simultaneously formed, respectively.

Also, it is preferable that the lower ends of the first plating laminated portions 30, 30', and 30" for forming the metal bump are surrounded by the first plating layers 31, 31', and 31" formed with gold, gold alloys, or gold fresh having superior electric characteristics.

Then, the oxide layer 71 is formed on the side surfaces of the second plating laminated portions 50, 50', and 50" from which the second pattern layer 41 has been removed. The oxide layer 71 improves the bonding strength between the second plating laminated portions 50, 50', and 50" and the molding compound 93, and thus provides a superior moldability. It is preferable that the oxide layer 71 is formed on the side surfaces of the fourth plating layer 51, the fifth plating layer 51', and the sixth plating layer 51" of the second plating laminated portions 50, 50', and 50", respectively, which are formed with copper or copper alloys, through a black oxide process. The oxide layer 71 has "I" shape.

Then, the pad frame 81 is laminated on the second plating laminated portions 50, 50', and 50" corresponding to the pad portion, the die 83 is attached onto the pad frame 81, and then the second plating laminated portions 50, 50', and 50" corresponding to the die and the lead portion are bonded with wires. Then, the upper part of the carrier frame 11 is molded with the molding compound 93, and a package singulation for removing by etching or physical method the carrier frame 11 and the base plating layer 21 is performed to complete the manufacture of the semiconductor package 1 according to the embodiment of the present invention. Since such processes are similar to those according to the prior art, the detailed description thereof will be omitted.

According to the semiconductor package 1 manufactured through the above-described processes according to an embodiment of the present invention, since the base plating layer 21 is plated on the whole part of the carrier frame 11 except for the pad portion and the lead portion, the plating quality is improved, and the bonding strength between the plating laminated portions and the molding compound 93 is improved through the forming of the oxide layer 71. Also, since it is not required to attach separate solder balls, the semiconductor package 1 can be manufactured promptly and easily. In particular, the method of manufacturing a semiconductor package according to the present invention is suitable for a high pin count.

Figure 4:
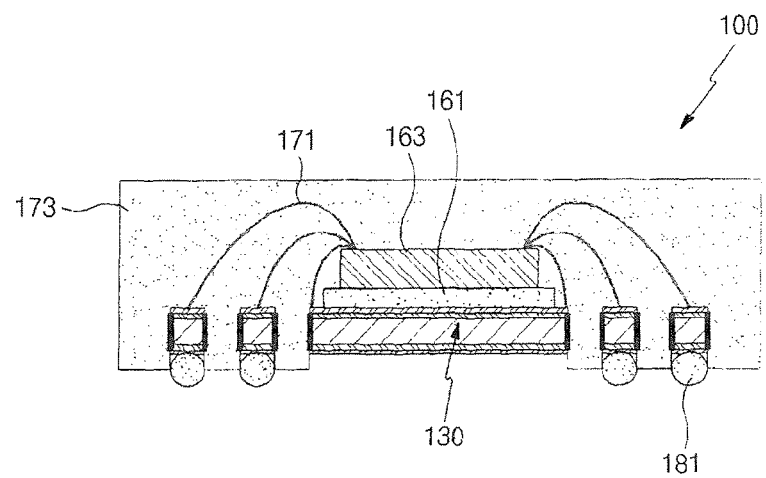
FIG. 4 is a sectional view of a semiconductor package manufactured by a method according to another embodiment of the present invention.
Figure 5A:
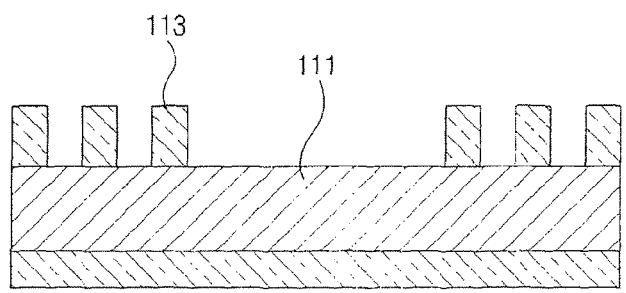
FIGS. 5a to 5h are views illustrating a process of manufacturing a semiconductor package according to another embodiment of the present invention.
Figure 5B:
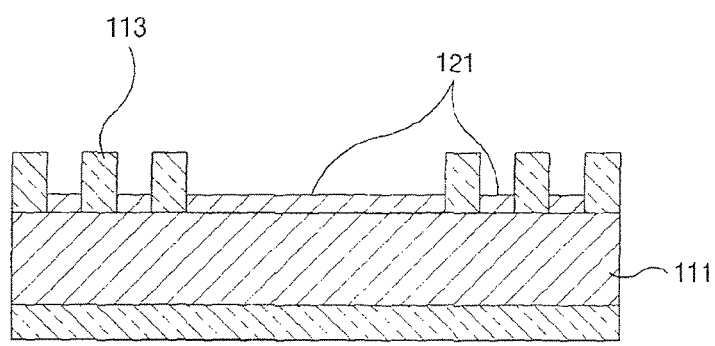
Figure 5C:
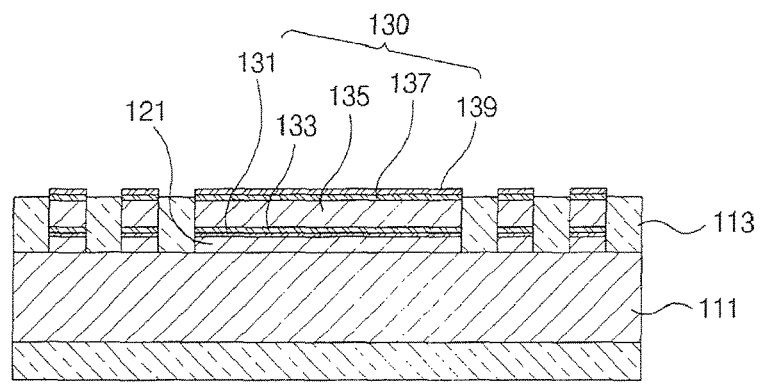
Figure 5D:
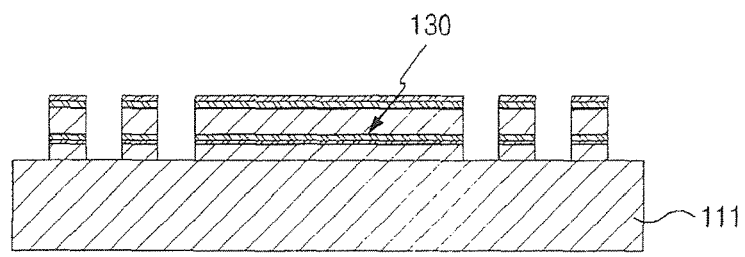
Figure 5E:
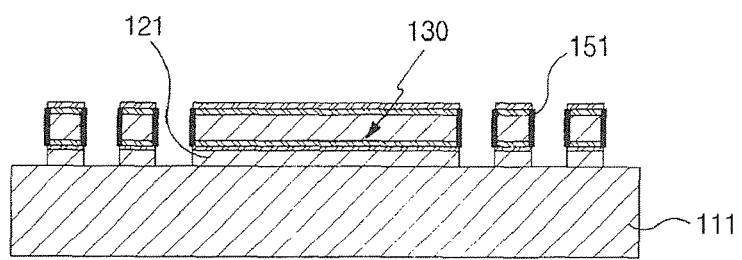
Figure 5F:
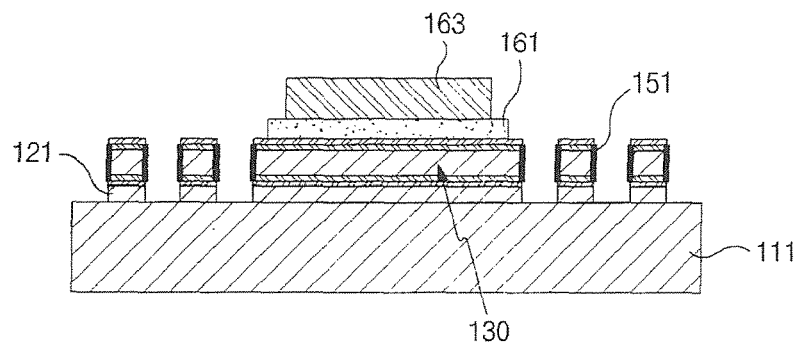
Figure 5G:
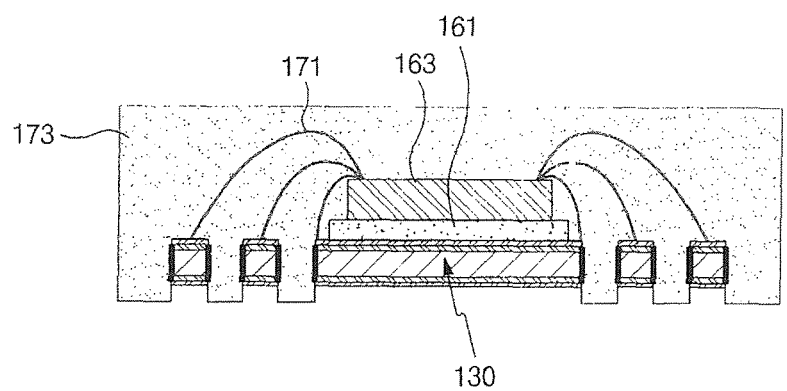
Figure 5H:
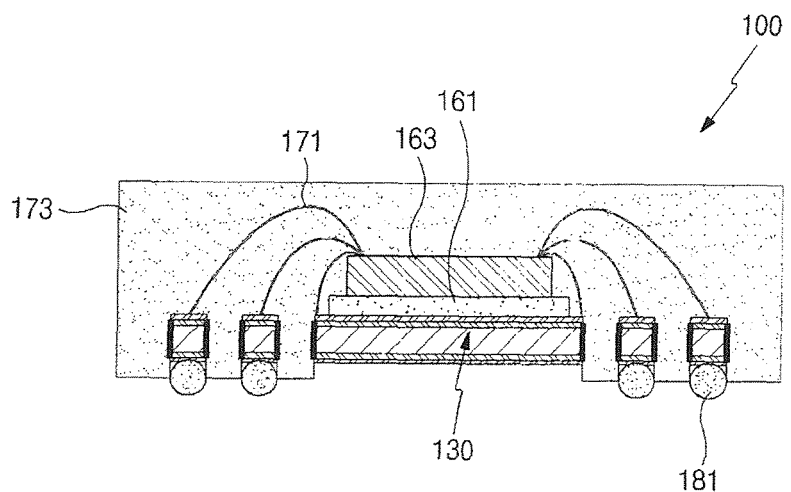
Figure 6A:
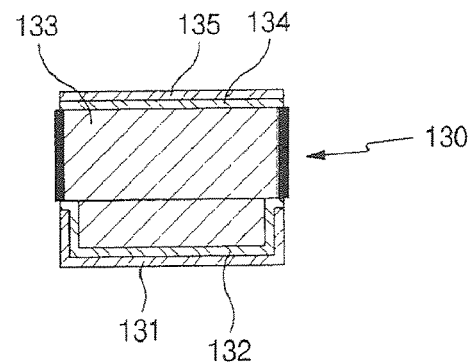
FIGS. 6a to 6c are sectional views illustrating modified examples of plating laminated portions in a method of manufacturing a semiconductor package according to another embodiment of the present invention.
Figure 6B:
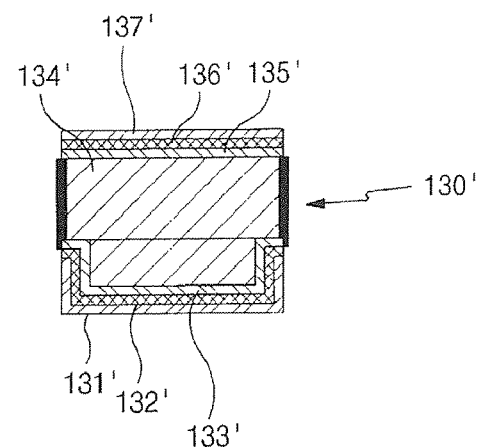
Figure 6C:
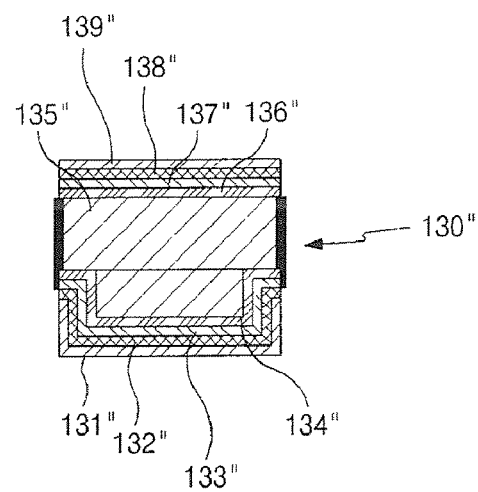

FIG. 4 is a sectional view of a semiconductor package 100 manufactured by a method according to another embodiment of the present invention, and FIGS. 5a to 5h are views illustrating a process of manufacturing a semiconductor package 100 according to another embodiment of the present invention. FIGS. 6a to 6c are sectional views illustrating modified examples of plating laminated portions in a method of manufacturing a semiconductor package 100 according to another embodiment of the present invention.

The method of manufacturing a semiconductor package 100 according to another embodiment of the present invention can improve the quality of plating, bonding efficiency, and moldability, and also improve the soldering efficiency in packaging the semiconductor package 100 onto a printed circuit board. As illustrated in FIGS. 4 to 6c, the method of manufacturing a semiconductor package 100 according to another embodiment of the present invention includes a first step of forming a pattern layer 113 on a part of a carrier frame 111 except for pad and lead portions using photoresist; a second step of forming a base plating layer 121 on the whole pad and lead portions with a height lower than the pattern layer 113; a third step of forming plating laminated portions 130, 130', and 130" on the base plating layer 121; a fourth step of removing the base plating layer 121; a fifth step of forming an oxide layer 151 on side surfaces of the plating laminated portions 130, 130', and 130" from which the base plating layer 121 has been removed; a sixth step of laminating a pad frame 161 on the plating laminated portions 130, 130', and 130" that correspond to the pad portion and attaching a die 163 onto the pad frame 161; a seventh step of removing by etching or physical method the carrier frame 111 and the base plating layer 121 after boding the plating laminated portions 130, 130', and 130" that correspond to the die 163 and the lead portion with wires 171 and molding an upper part of the carrier frame 111 with a molding compound 173; and an eighth step of attaching solder balls 181 onto lower ends of the plating laminated portions 130, 130', and 130" that correspond to the lead portion.

Here, the carrier frame 111 is to form a base plate for manufacturing the semiconductor package 100 including forming of a pattern, and it is preferable that the carrier frame is formed with copper or copper alloys, or nickel or nickel alloys.

On the carrier frame 111, the first pattern layer 113, which includes the pad portion on which the die 163 is laminated and various kinds of lead portions, is formed using photoresist.

Then, the base plating layer 121 is formed on the carrier frame 111, on which the pattern layer 113 is formed, with a height lower than the pattern layer 113. The base plating layer 121 is an important part that determines the plating quality, and it is preferable that the base plating layer 121 is formed on the whole part of the carrier frame 111 except for the pad portion and the lead portion to provide a superior plating quality. Also, the base plating layer 121 may be plated with one of copper or copper alloys, nickel or nickel alloys, gold, silver or silver alloys, and tin or tin alloys.

After the base plating layer 121 is formed, the pattern layer 113 is removed, and then the plating laminated portions 130, 130', and 130" are formed on the part from which the pattern layer 113 has been removed.

As illustrated in FIGS. 6a to 6c, the plating laminated portions 130, 130', and 130" may be formed in diverse forms. As illustrated in FIG. 6a, the plating laminated portion 130 may be composed of a first plating layer 131 plated with gold or gold alloys, a second plating layer 132 plated with nickel or nickel alloys, a third plating layer 133 plated with copper or copper alloys, a fourth plating layer 134 plated with nickel or nickel alloys, and a fifth plating layer 135 plated with gold, gold alloys, silver or silver alloys, which are laminated in order.

In another embodiment of the present invention, as illustrated in FIG. 6b, the plating laminated portion 130' may be composed of a first plating layer 131' plated with gold fresh, a second plating layer 132' plated with gold/silver alloys, a third plating layer 133' plated with nickel or nickel alloys, a fourth plating layer 134' plated with copper or copper alloys, a fifth plating layer 135' plated with nickel or nickel alloys, a sixth plating layer 136' plated with gold/silver alloys, and a seventh plating layer 137' plated with gold fresh, which are laminated in order.

Here, it is preferable that the gold/silver alloys forming the second plating layer 132' and the sixth plating layer 136' may be composed of 30 weight percent (wt %) gold and 70 wt % silver.

In still another embodiment of the present invention, as illustrated in FIG. 6c, the plating laminated portion 130" may be composed of a first plating layer 131" plated with gold fresh, a second plating layer 132" plated with gold/silver alloys, a third plating layer 133" plated with nickel or nickel alloys, a fourth plating layer 134" plated with nickel/copper alloys, a fifth plating layer 135" plated with copper or copper alloys, a sixth plating layer 136" plated with nickel/copper alloys, a seventh plating layer 137" plated with nickel or nickel alloys, an eighth plating layer 138" plated with gold/silver alloys, and a ninth plating layer 139, 139" plated with gold fresh, which are laminated in order.

Here, it is preferable that the gold/silver alloys forming the second plating layer 132" and the eighth plating layer 138" may be composed of 30 weight percent (wt %) gold and 70 wt % silver, and the nickel/copper alloys forming the fourth plating layer 134" and the sixth plating layer 136" may be composed of 70 wt % nickel and 30 wt % copper.

Then, the oxide layer 151 is formed on the side surfaces of the plating laminated portions 130, 130', and 130" from which the pattern layer 113 has been removed. The oxide layer 151 improves the bonding strength between the plating laminated portions 130, 130', and 130" and the molding compound 173, and thus provides a superior moldability. It is preferable that the oxide layer 151 is formed on the side surfaces of the third plating layer 133, the fourth plating layer 134', and the fifth plating layer 135" of the plating laminated portions 130, 130', and 130", respectively, which are formed with copper or copper alloys, through a black oxide process. The oxide layer 71 has "I" shape.

Then, the pad frame 161 is laminated on the plating laminated portions 130, 130', and 130" corresponding to the pad portion, the die 163 is attached onto the pad frame 161 and then the plating laminated portions 130, 130', and 130" corresponding to the die 163 and the lead portion are bonded with wires 171. Then, the upper part of the carrier frame 111 is molded with the molding compound 173, the carrier frame 111 and the base plating layer 121 are removed by etching or physical method, and then the solder balls 181 are attached onto the lower ends of the plating laminated portions 130, 130', and 130" corresponding to the lead portion to complete the manufacture of the semiconductor package 100 according to another embodiment of the present invention. Since such processes are similar to those according to the prior art, the detailed description thereof will be omitted.

According to the semiconductor package 100 manufactured through the above-described processes according to another embodiment of the present invention, since the base plating layer 121 is plated on the whole part of the carrier frame 111 except for the pad portion and the lead portion, the plating quality is improved, and the bonding strength between the plating laminated portions and the molding compound 173 is improved through the forming of the oxide layer 151

INDUSTRIAL APPLICABILITY

As can be seen from the foregoing, method of manufacturing a semiconductor package according to the present invention has the following effects.

During the plating with a thickness of 50~100 μm, the plating deviation is limited within 5 μm, and thus the size of the metal bump can be maintained constant with the improvement of the plating quality. Also, since the bonding strength between the molding compound and the pad frame and the soldering efficiency are improved, the method of manufacturing a semiconductor package according to the present invention is suitable for the high pin count.

A table below is a comparison table in which the bonding strength between the molding compound and the pad frame according to the present invention is compared with that according to the prior art.

|  | Prior Art | Present Invention |
|---|---|---|
| Maximum | 1.30 kgf | 1.66 kgf |
| Minimum | 0.93 kgf | 1.44 kgf |
| Average | 1.21 kgf | 1.53 kgf |

A table below is a comparison table in which the soldering efficiency according to the present invention is compared with that according to the prior art.

|  | Prior Art | Present Invention |
|---|---|---|
| Pitch | 400~500 μm | 200~300 μm |
| No. of Pins (10 × 10) | 70~80 pins | 150~200 pins |

As shown in the above tables, the bonding strength between the molding compound and the pad frame according to the present invention is improved over about 0.3 kgf in comparison to that according to the prior art, and the number of pins packaged in a small package according to the present invention becomes twice or more the number of pins according to the prior art.

While this invention has been described in connection with what is presently considered to be the most practical and preferred embodiment, it is to be understood that the invention is not limited to the disclosed embodiment and the drawings On the contrary, it is intended to cover various modifications and variations within the spirit and scope of the appended claims.

The invention claimed is:

1. A method of manufacturing a semiconductor package, comprising:
   a first step of forming a first pattern layer including pad and lead portions on a carrier frame;
   a second step of forming a base plating layer on a whole part of the carrier frame except for the pad and lead portions with a same height as the first pattern layer;

a third step of removing the first pattern layer and forming first plating laminated portions for forming a metal bump on a part from which the first pattern layer has been removed;

a fourth step of laminating a second pattern layer on the base plating layer;

a fifth step of laminating second plating laminated portions on the first plating laminated portions;

a sixth step of removing the second pattern layer;

a seventh step of forming an oxide layer on side surfaces of the second plating laminated portions from which the second pattern layer has been removed;

an eighth step of laminating a pad frame on the second plating laminated portions that correspond to the pad portion and attaching a die onto the pad frame; and a ninth step of removing by etching or physical method the carrier frame and the base plating layer after boding the second plating laminated portions that correspond to the die and the lead portion with wires and molding an upper part of the carrier frame with a molding compound.

2. The method of claim 1, wherein the carrier frame is formed with one of copper/copper alloys and nickel/nickel alloys.

3. The method of claim 2, wherein the base plating layer is plated with one of copper/copper alloys, nickel/nickel alloys, gold, silver/silver alloys, and tin/tin alloys.

4. The method of claim 3, wherein the first plating laminated portions are composed of a first plating layer plated with gold or gold alloys, a second plating layer plated with nickel or nickel alloys, and a third plating layer plated with copper or copper alloys, which are laminated in order; and wherein the second plating laminated portions are composed of a fourth plating layer plated with copper or copper alloys, a fifth plating layer plated with nickel or nickel alloys, and a sixth plating layer plated with gold, gold alloys, silver or silver alloys, which are laminated in order.

5. The method of claim 3, wherein the first plating laminated portions are composed of a first plating layer plated with gold fresh, a second plating layer plated with gold/silver alloys, a third plating layer plated with nickel or nickel alloys, and a fourth plating layer plated with copper or copper alloys, which are laminated in order; and wherein the second plating laminated portions are composed of a fifth plating layer plated with copper or copper alloys, a sixth plating layer plated with nickel or nickel alloys, a seventh plating layer plated with gold/silver alloys, and an eighth plating layer plated with gold fresh, which are laminated in order.

6. The method of claim 3, wherein the first plating laminated portions are composed of a first plating layer plated with gold fresh, a second plating layer plated with gold/silver alloys, a third plating layer plated with nickel or nickel alloys, a fourth plating layer plated with nickel/copper alloys, and a fifth plating layer plated with copper or copper alloys, which are laminated in order; and wherein the second plating laminated portions are composed of a sixth plating layer plated with copper or copper alloys, a seventh plating layer plated with nickel/copper alloys, an eighth plating layer plated with nickel or nickel alloys, a ninth plating layer plated with gold/silver alloys, and a tenth plating layer plated with gold fresh, which are laminated in order.

7. The method of claim 5, wherein the gold/silver alloys forming the second plating layer and the seventh plating layer are composed of 30 weight percent (wt %) gold and 70 wt % silver.

8. The method of claim 6, wherein the gold/silver alloys forming the second plating layer and the ninth plating layer are composed of 30 weight percent (wt %) gold and 70 wt % silver, and the nickel/copper alloys forming the fourth plating layer and the seventh plating layer are composed of 70 wt % nickel and 30 wt % copper.

9. The method of claim 1, wherein the oxide layer is formed through a black oxide process and has "I" shape.

10. The method of claim 4, wherein lower ends of the first plating laminated portions are surrounded by the first plating layer.

11. A method of manufacturing a semiconductor package, comprising:

a first step of forming a pattern layer on a part of a carrier frame except for pad and lead portions using photoresist;

a second step of forming a base plating layer on the whole pad and lead portions with a height lower than the pattern layer;

a third step of forming plating laminated portions on the base plating layer;

a fourth step of removing the pattern layer;

a fifth step of forming an oxide layer on side surfaces of the plating laminated portions from which the pattern layer has been removed;

a sixth step of laminating a pad frame on the plating laminated portions that correspond to the pad portion and attaching a die onto the pad frame;

a seventh step of removing by etching or physical method the carrier frame and the base plating layer after boding the plating laminated portions that correspond to the die and the lead portion with wires and molding an upper part of the carrier frame with a molding compound; and an eighth step of attaching solder balls onto lower ends of the plating laminated portions that correspond to the lead portion.

12. The method of claim 11, wherein the carrier frame is formed with one of copper/copper alloys and nickel/nickel alloys.

13. The method of claim 12, wherein the base plating layer is plated with one of copper/copper alloys, nickel/nickel alloys, gold, silver/silver alloys, and tin/tin alloys.

14. The method of claim 13, wherein the plating laminated portions are composed of a first plating layer plated with gold or gold alloys, a second plating layer plated with nickel or nickel alloys, a third plating layer plated with copper or copper alloys, a fourth plating layer plated with nickel or nickel alloys, and a fifth plating layer plated with gold, gold alloys, silver or silver alloys, which are laminated in order.

15. The method of claim 13, wherein the plating laminated portions are composed of a first plating layer plated with gold fresh, a second plating layer plated with gold/silver alloys, a third plating layer plated with nickel or nickel alloys, a fourth plating layer plated with copper or copper alloys, a fifth plating layer plated with nickel or nickel alloys, a sixth plating layer plated with gold/silver alloys, and a seventh plating layer plated with gold fresh, which are laminated in order.

16. The method of claim 13, wherein the plating laminated portions are composed of a first plating layer plated with gold fresh, a second plating layer plated with gold/silver alloys, a third plating layer plated with nickel or nickel alloys, a fourth plating layer plated with nickel/copper alloys, a fifth plating layer plated with copper or copper alloys, a sixth plating layer plated with nickel/copper alloys, a seventh plating layer plated with nickel or nickel alloys, an eighth plating layer plated with gold/silver alloys, and a ninth plating layer plated with gold fresh, which are laminated in order.

17. The method of claim 15, wherein the gold/silver alloys forming the second plating layer and the seventh plating layer are composed of 30 weight percent (wt %) gold and 70 wt % silver.

18. The method of claim 16, wherein the gold/silver alloys forming the second plating layer and the ninth plating layer are composed of 30 weight percent (wt %) gold and 70 wt % silver, and the nickel/copper alloys forming the fourth plating layer and the seventh plating layer are composed of 70 wt % nickel and 30 wt % copper.

19. The method of claim 11, wherein the oxide layer is formed through a black oxide process and has "I" shape.

* * * * *